April 22, 1969 J. F. SUTHERLAND 3,440,437

SIGNAL COUPLED LOGIC GATE CIRCUIT

Filed Nov. 12, 1964 Sheet 1 of 2

WITNESSES:
Bernard R. Gieguez
James F. Young

INVENTOR
James F. Sutherland
BY W. J. Brodahl
ATTORNEY

SIGNAL COUPLED LOGIC GATE CIRCUIT

United States Patent Office 3,440,437
Patented Apr. 22, 1969

3,440,437

SIGNAL COUPLED LOGIC GATE CIRCUIT

James F. Sutherland, Pittsburgh, Pa., assignor to Westinghouse Electric Corporation, East Pittsburgh, Pa., a corporation of Pennsylvania Filed Nov. 12, 1964, Ser. No. 410,640
Int. Cl. H03k 19/00
U.S. Cl. 307—88 3 Claims

ABSTRACT OF THE DISCLOSURE

There is disclosed computer signal control apparatus, including a signal coupled logic gate circuit including a pulse transformer having a plurality of coupled windings, with one such winding having a selected one of a high impedance or a low impedance to determine the effective coupling between two other windings for controlling an output signal.

BACKGROUND OF THE INVENTION

It has been known in the prior art to provide signal logic circuits, wherein an output signal is supplied upon the simultaneous energization of the circuit by a plurality of input signals. One such well known logic circuit is an AND circuit, requiring concurrent energization by a plurality such as three or more input signals to provide an output signal. One problem with the use of this prior art logic circuit can be the need for an output signal having a longer time duration than the applied input signals. Also, the need for an output signal having substantially more power than the input signal can be desired.

SUMMARY OF THE PRESENT INVENTION

It is an object of the present invention to provide an improved signal logic circuit having a better time duration relationship between applied input signals and the provided output signal.

It is a different object of the present invention to provide an improved signal logic circuit wherein a better controlled coupling is obtained between the applied input signals before an output signal is realized and a better storage of the input signal pattern is obtained as desired for the output signal providing devices.

It is an additional object of the present invention to provide an improved signal logic circuit utilizing faster acting input signal switching means having the ability to store the thereby provided output signal for the slower acting output power control device.

These and other objects of the present invention are accomplished by a signal coupled logic gate circuit, operative with a signal matrix address circuit and including one or more magnetically coupled controlled rectifiers to determine the energization of an output signal device. Each logic gate circuit includes a pulse transformer having a plurality of coupled windings, with a first said winding being energized by the current from at least one input signal and a second said winding having one of either a low impedance or a high impedance connected across it in accordance with the provision of another input signal. When a high input impedance is so provided as determined by the provision of said another input signal, a third said winding has induced therein an output current which triggers on a controlled rectifier switch to energize the output signal device.

BRIEF DESCRIPTION OF THE DRAWINGS

The various features of the present invention may better be understood with reference to the accompanying drawings, wherein.

DESCRIPTION OF A PREFERRED EMBODIMENT

Figure 1:
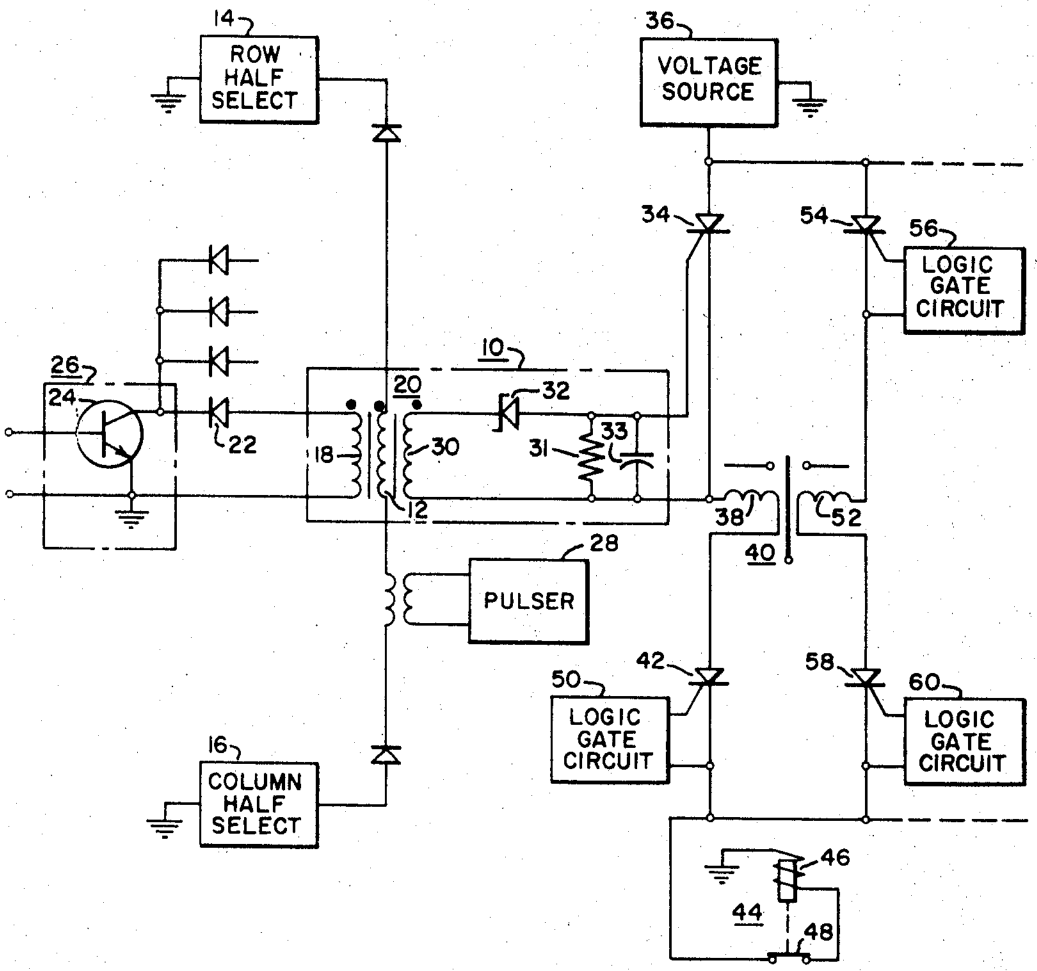
FIGURE 1 shows the signal coupled logic gate circuit in accordance with the teachings of the present invention provided to energize an output signal device.

In FIG. 1 there is shown a logic gate circuit 10 in accordance with the present invention, and including a first winding 12 connected to be energized with a current through a conventional row half select circuit 14 and a conventional column half select circuit 16 which, per se, are well known to persons skilled in the computer art. A second winding 18 of the pulse transformer 20 is connected through a diode 22 to a switching transistor 24 within a binary diode matrix decoding circuit 26 operative with a well known output data register (not shown) within a computer. A well known pulser circuit 28 is operative to provide the signal current through the winding 12, when a proper selected switch within the row half select 14 is closed and a proper selected switch within the column half select 16 is closed. A third winding 30 is connected through a Zener breakdown diode 32 to the gate lead of a controlled rectifier 34 such that a current pulse applied to the gate lead of the controlled rectifier 34 causes it to trigger on and become conductive relative to current from a voltage source 36 through a control winding 38 of a relay 40. A second controlled rectifier 42 is included in the circuit through the winding 38 and when triggered on conducts through a power supply dipping switch 44. The latter switch 44 can comprise a load current sensing relay having a mechanical time delay such that after two milliseconds of current flow through the control winding 38 the control winding 46 of the relay 44 will open the circuit through the contact arm 48 for a long enough time period for the controlled rectifiers 34 and 42 to shut off and thereby cease to conduct current from the voltage source 36.

The controlled rectifier 42 is triggered on and becomes conductive by a logic gate circuit 50, generally similar to the logic gate circuit 10, except that the pulse transformer does not include the winding 18 shown with the pulse transformer 20. Pulser circuit 28 can drive the logic gate circuits 10, 50, 56, 60 in common if desired.

The winding 38 of relay 40, which is shown as a bistable reed type of relay, may be operative as a set winding for the relay 40, with another winding 52 being operative as a reset winding for the relay 40. The latter winding 52 is energized by a current from the voltage source 36 passing through a controlled rectifier 54, the conduction of which is determined by a logic gate circuit 56, and passing through a controlled rectifier 58, the conduction of which is determined by a logic gate circuit 60. The power supply dipping switch 44 is connected as a load current sensing relay as previously described.

Figure 2:
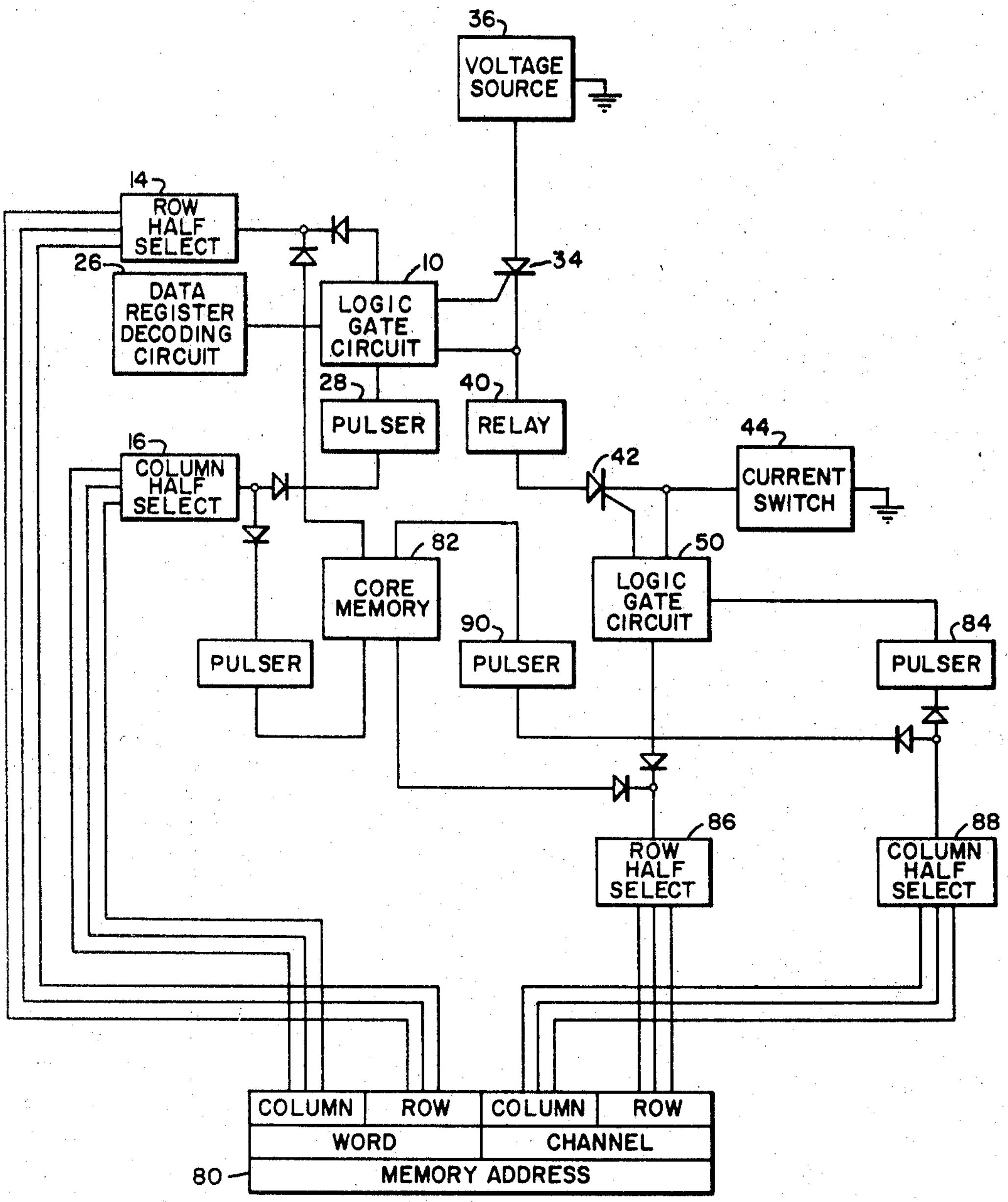
FIG. 2 shows one application for the logic gate circuit in accordance with this invention.

In FIG. 2 there is shown the voltage source 36 connected to energize the relay 40 through controlled rectifier 34 and controlled rectifier 42, with the power supply dipping current switch 44 being shown connected in the circuit. The logic gate circuit 10 is energized by a current pulse from the pulser 28 through the circuit including a row half select switch 14 and a column half select switch 16, which latter half select circuits are operative in a well known manner with the memory address 80 conventional within a computer for driving a particular core location within a core memory 82 through the half select circuits 14 and 16 as is well known in this particular art. The logic gate circuit 10 determines the conduction of the controlled rectifier 34 relative to current from the voltage source 36 through the relay 40. Similarly, the logic gate circuit 50 determines the conduction of the controlled rectifier 42 for the energization of the same relay 40 by current from the voltage source 36. The logic gate circuit 50 is energized by a current signal from a separate pulser 84, or the same pulser 28 as is operative with the logic gate circuit 10 if desired, operative through a row half select circuit 86 and a column half select circuit 88, which latter circuits are operative with the memory address 80. The same switch within the row half select circuit 86 and the same switch within the row half select circuit 88 are operative with a pulser 90 for energizing a particular core location within the core memory 82 as is well known to persons skilled in this particular art.

Thusly, it will be seen that a matrix circuit, having the advantage of an efficient way of addressing a unique computer contact closure output switch from a large group of such output switches has been shown. The attractiveness of the matrix arrangement is enhanced by the magnetically coupled signal logic gate circuits including controlled rectifiers at each desired matrix intersection which can be either switched on or not switched on as determined by a masking data word from an internal computer register.

In reference to FIG. 19, the data word determines the conduction of the switching transistor 24 shown in the binary decoding circuit 26. The controlled rectifier 34 operative with the signal logic gate circuit 10 can be triggered on by the main frame speed pulses having a time duration in the order of 4 microseconds and a signal strength in the order of 100 microamps, and yet the circuit operation is such that the controlled rectifier 34 provides a storage of the corresponding bit pattern for a time duration long enough for the bistable relay 40 to be set or reset. In general, the two controlled rectifiers 34 and 42 are operative to provide the set operation for the relay 40, and the reset operation for the relay 40 is provided through the operation of controlled rectifiers 54 and 58 relative to the winding 52. In applications where the ultimate load such as an indicator lamp, servomotor, or annunciators requires direct current, suitably commutated controlled rectifiers can control it directly without the interposing relay 40 by direct energization with the current signal from the voltage source 36.

In the drawings the controlled rectifiers, such as controlled rectifier 34, are shown located at each row, column and data bit intersection. Note that unless the row select circuit 14 is made conductive by a row decoder and the column half select circuit 16 is made conductive by a column decoder, the current signal from the pulser 28 cannot flow through the winding 12 of the pulse transformer 20. Further it is necessary for a current signal to be induced in the output winding 30 that the transistor switch 24 be not conductive through absence of data drive to transistor switch 24. The current pulse through the winding 12 induces a current signal in the winding 18 which will dissipate the energy in the winding 12 if the transistor 24 is conductive to effectively short circuit the winding 18. There must be provided a coupling between the winding 12 and the output winding 30 such that there is induced in the circuit of the winding 30 an output current signal to trigger on the controlled rectifier 34.

If the signal in the winding 12 is in the order of 10 volts, there can be provided an output signal from the winding 30 in the order of 8 volts. When the Zener diode 32 breaks down at about 3 volts, there results a signal energization of the gate lead of the controlled rectifier 34 such that the controlled rectifier 34 triggers on and becomes conductive. The capacitor 33 is provided to filter the higher frequency noise pulses from otherwise triggering on the controlleed rectifier 34. The resistor 31 is provided to discharge capacitor 33 between computer output operations. Current from the voltage source 36 can flow through the conductive controlled rectifier 34 to energize the set winding 38 of the relay 40, provided that the controlled rectifier 42 is also conductive at this same time. Once the controlled rectifiers 34 and 42 are triggered on to become conductive, they continue to be conductive until the current flow from the voltage source 36 is interrupted for a time period long enough for the controlled rectifiers to again block the current flow from the voltage source 36. There is provided for this purpose a power supply dipping current switch 44 which interrupts the current through the relay winding 38 after it has flowed in the order of 2 milliseconds.

It should thereby be readily apparent that the signal logic gate circuit 10 in accordance with the present invention is responsive to a 4 microsecond pulsing signal from the pulser 28 and provides a 2 millisecond output signal through the relay winding 38 with a substantial power gain in that the current flow from the voltage source 36 through the relay winding 38 is in the order of 10 milliamps up to 500 milliamps when the current flow through the winding 12 from the pulser 28 is in the order of 200 microamps.

The following component values were employed in an operative embodiment of the present invention, with one such embodiment being constructed for a 24 volt DC voltage source 36.

| | |
|---|---|
| Zener diode **32** | 2.7 v. |
| Resistor **31** | 1,000 ohms. |
| Capacitor **33** | .01 microfarads. |
| Controlled rectifier **34** | Gate current 200 $\mu$ amps.<br>Anode current 500 milliamps.<br>1 $\mu$sec. turn on time.<br>50 $\mu$sec. turn off. |
| Pulse transformer **20** | 1:1:1 turns ratio. |
| Pulser **28** | 4 microsecond 12 volts. |

Although the present invention has been described with a certain degree of particularity, it should be understood that the present disclosure has been made only by way of example and that numerous changes in the details of construction and the combination and arrangement of parts may be resorted to without departing from the scope and the spirit of the present invention.

I claim as my invention:

1. In a signal logic gate circuit operative to provide an output signal upon the simultaneous application of a control signal and a signal pulse, the combination of a pulse transformer having a plurality of coupled windings, a first of said windings being connected to receive said signal pulse, first switch means connected to a second of said windings and operative to provide one of a low impedance path and a high impedance path connected around the second winding in response to said control signal, and second switch means connected to a third of said windings and being conductive in response to said signal pulse when the first switch means is providing a high impedance path connected around the second winding such that said output signal is thereby provided.

2. In a signal coupling circuit for providing an output signal to a load upon simultaneous energization by a control signal and a signal pulse, the combination of signal coupling means having a plurality of input windings, a first of said input windings being connected to receive said signal pulse, first switch means connected to a second of said input windings and operative to provide a high impedance path around the second input winding in response to said control signal, and second switch means connected to a third of said input windings and being conductive in response to said signal pulse when the first switch means is providing a high impedance around the second input winding such that said output signal is thereby provided.

3. In a signal logic gate circuit operative to provide an output signal upon the simultaneous application of a plurality of control signals, the combination of a pulse transformer having a plurality of coupled windings, a first of said windings being connected to receive a first control signal, first switch means connected to a second of said windings and operative to provide an impedance path around the second winding in response to a second of said control signals such that current flow in said second winding is substantially blocked, and second switch means connected to a third of said windings and being conductive in response to said first control signal when the first switch means is responding to said second control signal to block current flow in the second winding such that the third winding is effective to provide said output signal.

References Cited

UNITED STATES PATENTS 3,193,691 7/1965 Akmenkalns ---------- 307—88
3,149,237 9/1964 Lawrence ------------ 307—88
2,813,207 11/1957 Bonn --------------- 307—88

TERRELL W. FEARS, *Primary Examiner.*

PHILIPS SPERBER, *Assistant Examiner.*